US011705379B2

(12) United States Patent
Lee et al.

(10) Patent No.: US 11,705,379 B2
(45) Date of Patent: Jul. 18, 2023

(54) SEMICONDUCTOR PACKAGES

(71) Applicant: Samsung Electronics Co., Ltd., Suwon-si (KR)

(72) Inventors: Chanho Lee, Hwaseong-si (KR); Won Kim, Uijeongbu-si (KR); Haeseok Park, Yongin-si (KR); Ilgeun Jung, Seoul (KR); Jinkuk Bae, Hwaseong-si (KR); Inyoung Lee, Yongin-si (KR); Sungdong Cho, Hwaseong-si (KR)

(73) Assignee: Samsung Electronics Co., Ltd.

( * ) Notice: Subject to any disclaimer, the term of this patent is extended or adjusted under 35 U.S.C. 154(b) by 225 days.

(21) Appl. No.: 17/087,879

(22) Filed: Nov. 3, 2020

(65) Prior Publication Data
US 2021/0305114 A1 Sep. 30, 2021

(30) Foreign Application Priority Data
Mar. 26, 2020 (KR) .................. 10-2020-0037080

(51) Int. Cl.
*H01L 23/31* (2006.01)
*H01L 25/065* (2023.01)
(Continued)

(52) U.S. Cl.
CPC ...... *H01L 23/3171* (2013.01); *H01L 23/3135* (2013.01); *H01L 24/13* (2013.01); *H01L 24/14* (2013.01); *H01L 24/16* (2013.01); *H01L 24/73* (2013.01); *H01L 25/0657* (2013.01); *H01L 25/18* (2013.01); *H01L 22/12* (2013.01); *H01L 2224/0401* (2013.01); *H01L 2224/05073* (2013.01); *H01L 2224/05166* (2013.01); *H01L 2224/05573* (2013.01); *H01L 2224/05647* (2013.01); *H01L 2224/10125* (2013.01); *H01L 2224/13016* (2013.01); *H01L 2224/1357* (2013.01); *H01L 2224/13147* (2013.01);
(Continued)

(58) Field of Classification Search
CPC .................................................. H01L 23/3171
See application file for complete search history.

(56) References Cited

U.S. PATENT DOCUMENTS 7,622,309 B2   11/2009  Su et al.
8,268,717 B2   9/2012   Yang
(Continued)

*Primary Examiner* — William A Harriston
(74) *Attorney, Agent, or Firm* — Myers Bigel, P.A.

(57) ABSTRACT

A semiconductor package may include a base, a first chip on the base, and first connection patterns that connect and couple the base and the first chip. The first chip may include a substrate, pad patterns on the substrate, a passivation layer on the substrate and having openings, and pillars on the substrate, the pad patterns include a first signal pad and a second signal pad, the first connection patterns are in contact with the pillars, the pillars include a first signal pillar in contact with the first signal pad and a second signal pillar in contact with the second signal pad, the openings in the passivation layer include a first opening having a sidewall facing a side surface of the first signal pillar and surrounding the side surface of the first signal pillar, and a second opening having a sidewall facing a side surface of the second signal pillar and surrounding the side surface of the second signal pillar, and a maximum width of the second opening is greater than a maximum width of the first opening.

20 Claims, 14 Drawing Sheets

(51) Int. Cl.
 *H01L 25/18* (2023.01)
 *H01L 21/66* (2006.01)
 *H01L 23/00* (2006.01)

(52) U.S. Cl.
 CPC ............ *H01L 2224/13564* (2013.01); *H01L 2224/13583* (2013.01); *H01L 2224/13611* (2013.01); *H01L 2224/13639* (2013.01); *H01L 2224/13647* (2013.01); *H01L 2224/13655* (2013.01); *H01L 2224/13657* (2013.01); *H01L 2224/14515* (2013.01); *H01L 2224/16227* (2013.01); *H01L 2224/73204* (2013.01); *H01L 2225/06513* (2013.01); *H01L 2225/06517* (2013.01); *H01L 2924/1436* (2013.01)

(56) References Cited

U.S. PATENT DOCUMENTS

| | | |
|---|---|---|
| 8,618,827 B2 | 12/2013 | Shao et al. |
| 9,245,860 B2 | 1/2016 | Feustel et al. |
| 9,257,402 B2 | 2/2016 | Yoshida et al. |
| 9,735,123 B2 | 8/2017 | Lee et al. |
| 9,871,012 B2 | 1/2018 | Srinivas et al. |
| 10,103,119 B2 | 10/2018 | Farooq et al. |
| 2005/0245067 A1 | 11/2005 | Lin |
| 2014/0061897 A1* | 3/2014 | Lin .................. H01L 24/17 257/737 |
| 2019/0279953 A1 | 9/2019 | Chen et al. |

* cited by examiner

SEMICONDUCTOR PACKAGES

CROSS-REFERENCE TO RELATED APPLICATION(S)

This application claims the benefit under 35 USC § 119(a) of Korean Patent Application No. 10-2020-0037080 filed on Mar. 26, 2020, in the Korean Intellectual Property Office, the entire disclosure of which is incorporated herein by reference for all purposes.

BACKGROUND

1. Field

The present disclosure relates to semiconductor packages, and more particularly, to a semiconductor package including a plurality of pillars and a passivation layer.

2. Description of Related Art

With the miniaturization of semiconductor packages, the size of bumps has been reduced. As the bumps are reduced in size, there may be a corresponding deterioration in the reliability and durability of the bumps.

SUMMARY

Aspects of the present disclosure provide semiconductor packages having relatively high reliability.

Aspects of the present disclosure provide semiconductor packages which may have a capability of reliably testing a bonding force of a pillar.

According to an example embodiment, a semiconductor package is provided. The semiconductor package includes a base, a first chip on the base, and first connection patterns that connect and couple the base and the first chip. The first chip includes a substrate, pad patterns on the substrate, a passivation layer disposed on the substrate and having openings, and pillars on the substrate, the pad patterns include a first signal pad and a second signal pad, the first connection patterns are in contact with the pillars, the pillars include a first signal pillar in contact with the first signal pad and a second signal pillar in contact with the second signal pad, the openings in the passivation layer include a first opening having a sidewall facing a side surface of the first signal pillar and surrounding the side surface of the first signal pillar, and a second opening having a sidewall facing a side surface of the second signal pillar and surrounding the side surface of the second signal pillar, and a maximum width of the second opening is greater than a maximum width of the first opening.

According to an example embodiment, a semiconductor package is provided. The semiconductor package includes a substrate, pad patterns on the substrate, a passivation layer on the substrate and having openings, pillars on the substrate, and connection patterns on the pillars. The pad patterns include a first signal pad and a second signal pad, the pillars include a first signal pillar in contact with the first signal pad, and a second signal pillar in contact with the second signal pad, a center between upper and lower surfaces of each of the pillars is positioned on a level higher than a level of an upper surface of the passivation layer, when viewed from the substrate, the openings in the passivation layer include a first opening and a second opening having different sizes or widths, the first signal pillar passes through the first opening, and the second signal pillar passes through the second opening.

According to an example embodiment, a semiconductor package includes a substrate, a plurality of pad patterns on the substrate, a passivation layer on the substrate and having a plurality of openings, a plurality of pillars on the substrate, and connecting layers on the plurality of pillars. The plurality of pad patterns include a plurality of signal pads, the plurality of pillars include a plurality of signal pillars contacting the plurality of signal pads and a plurality of dummy pillars spaced apart from the plurality of pad patterns, the openings in the passivation layer include a first opening and a second opening, the plurality of signal pads include a first signal pad and a second signal pad, the plurality of pillars include a first signal pillar in the first opening and a second signal pillar in the second opening, a maximum distance between the first signal pillar and the first opening is less than ½ of a width of the first signal pillar, and a maximum distance between the second signal pillar and the second opening is greater than the width of the first signal pillar.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
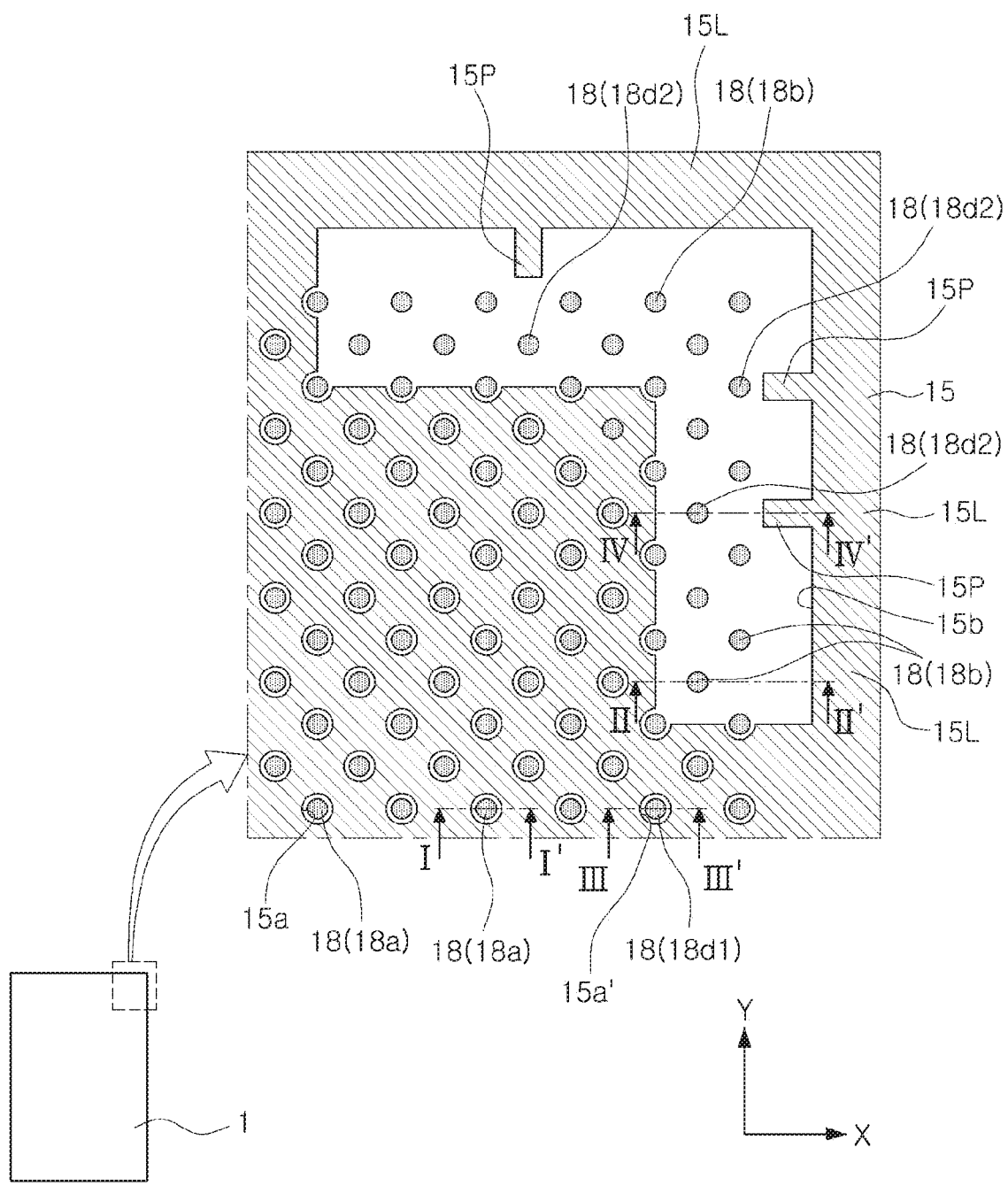
FIG. 1 is a schematic plan view of a semiconductor package according to some example embodiments.
Figure 2A:
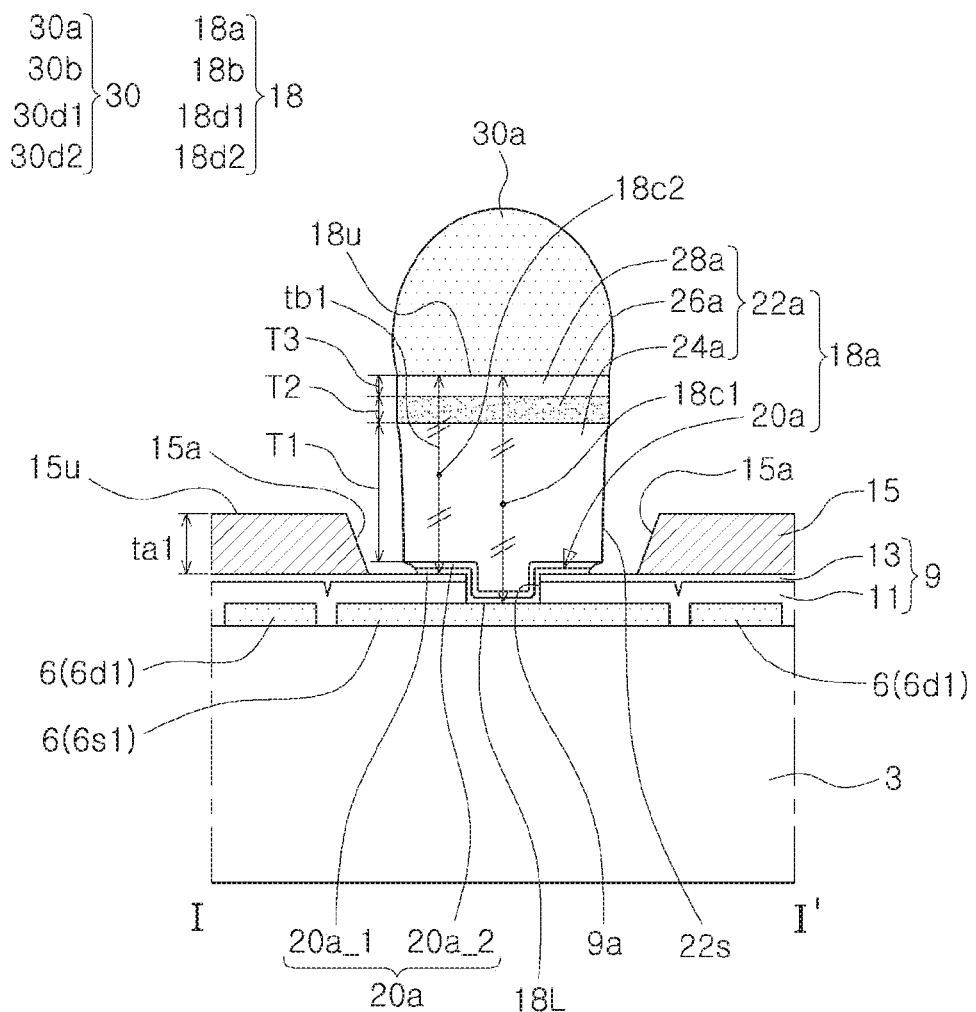
FIGS. 2A to 2D are schematic cross-sectional views illustrating an example of a semiconductor package according to some example embodiments.
Figure 2B:
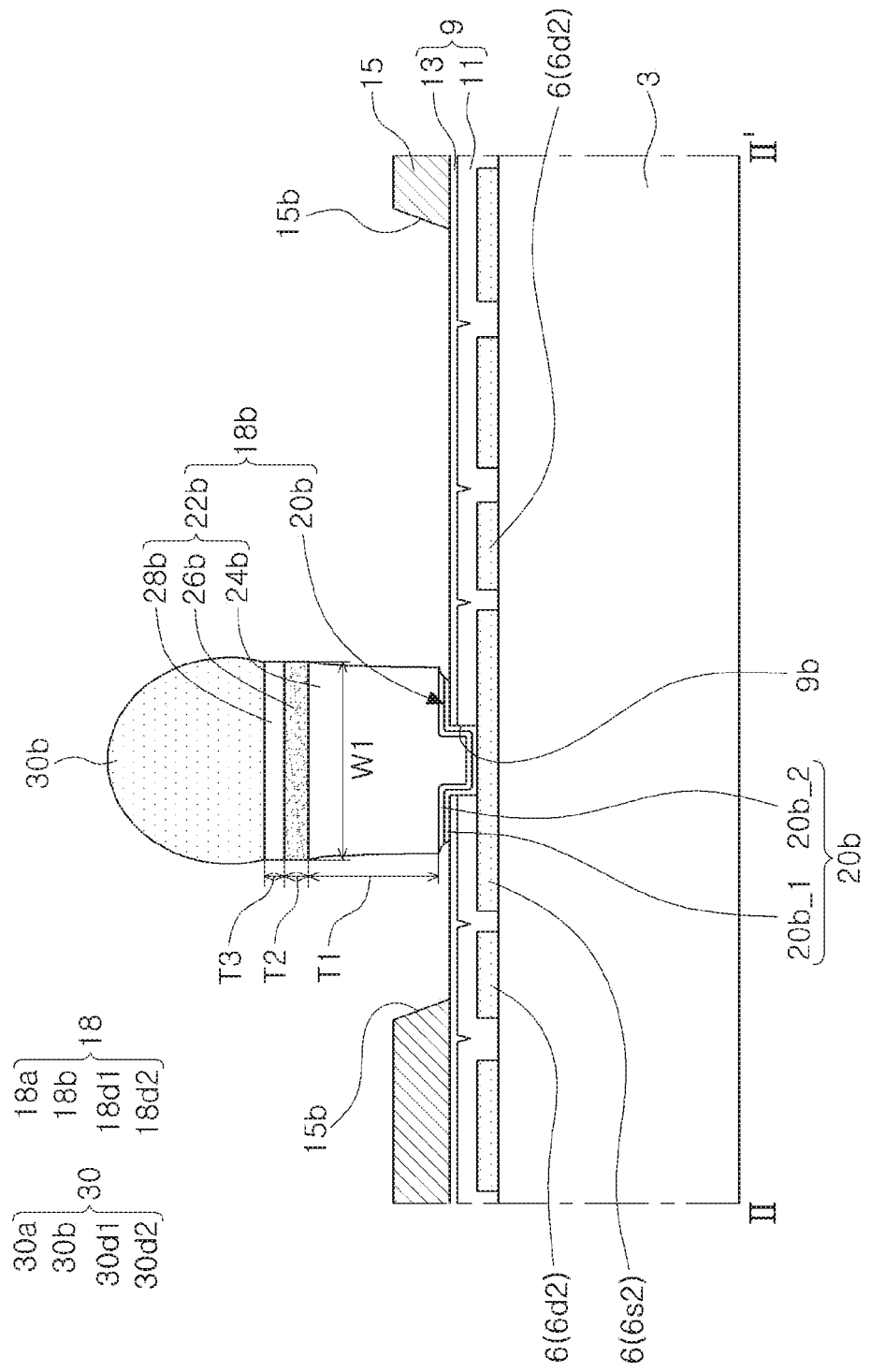
Figure 2C:
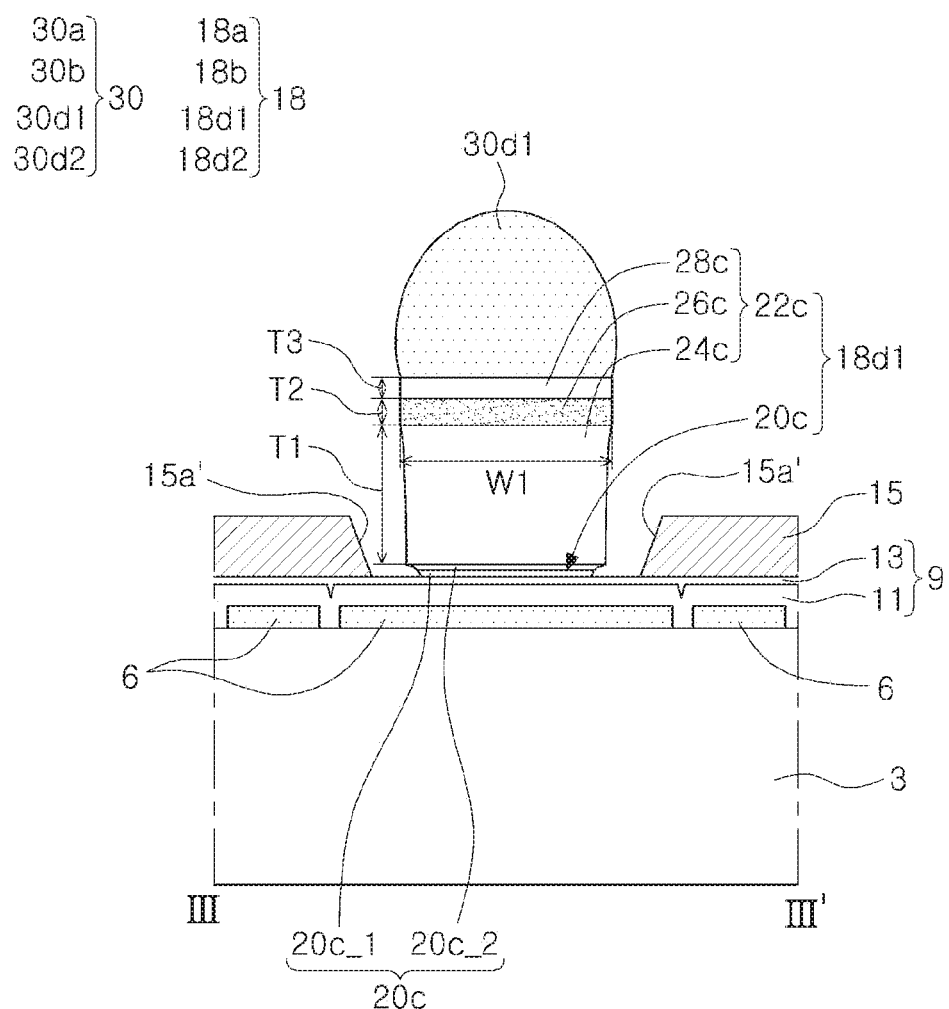
Figure 2D:
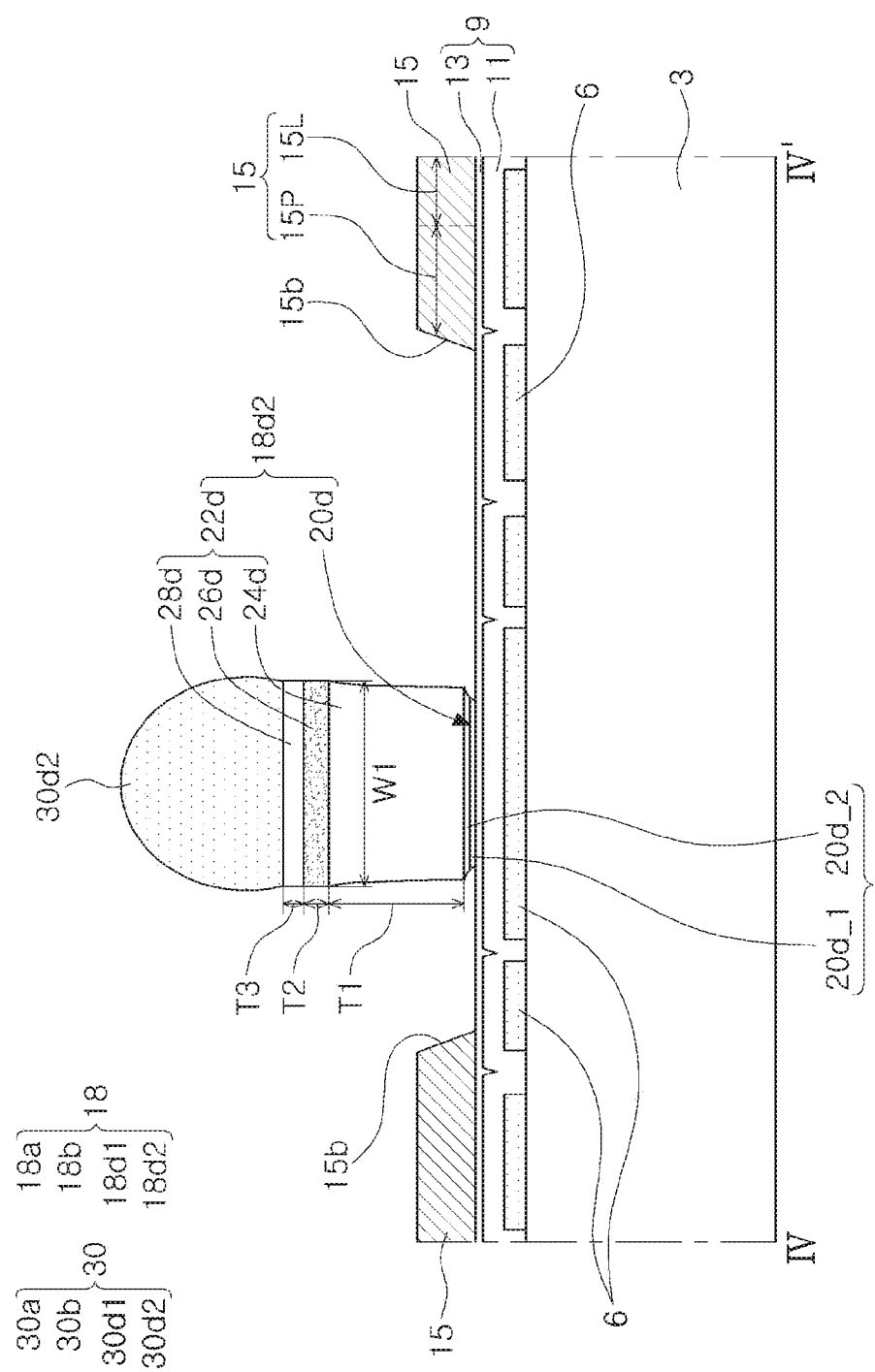

An example of a semiconductor package according to some example embodiments of the present inventive concepts will be described with reference to FIGS. 1 and 2A to 2D. FIG. 1 is a schematic plan view illustrating the semiconductor package according to some example embodiments, and FIGS. 2A to 2D are schematic cross-sectional views illustrating the semiconductor package of FIG. 1. More specifically, FIG. 2A is a cross-sectional view illustrating an area taken along line I-I' of FIG. 1, FIG. 2B is a cross-sectional view illustrating an area taken along line II-IF of FIG. 1, FIG. 2C is FIG. 1 is a cross-sectional view illustrating an area taken along line of FIG. 1, and FIG. 2D is a cross-sectional view illustrating an area taken along line IV-IV' of FIG. 1.

Referring to FIGS. 1 and 2A to 2D, a semiconductor package 1 in some example embodiments may include a substrate 3, pad patterns 6 on the substrate 3, a passivation layer 15 on the substrate 3 and having openings, pillars 18 on the substrate 3, and connection patterns 30 on the pillars 18.

In some example embodiments, the substrate 3 may be or may include a semiconductor chip such as a logic semiconductor chip or a memory semiconductor chip. For example, the substrate 3 may be or may include an SRAM memory cell and/or an integrated circuit of a logic semiconductor chip, or memory cells of a memory semiconductor chip. For example, the substrate 3 may be or may include memory cells of a dynamic random access memory (DRAM), a phase-change RAM (PRAM), a resistive RAM (ReRAM), or a magnetoresistive RAM (MRAM).

In some example embodiments, the substrate 3 may be a silicon interposer substrate or a redistribution substrate.

The pad patterns 6 may include signal pads. The signal pads may include first signal pads 6s1 and second signal pads 6s2. The pad patterns 6 may include a metallic material, for example, a material such as tungsten (W), tungsten nitride (WN), titanium (Ti), titanium nitride (TiN), titanium aluminide (TiAl), titanium aluminum carbide (TiAlC), tantalum (Ta), tantalum nitride (TaN), nickel (Ni), cobalt (Co), manganese (Mn), aluminum (Al), molybdenum (Mo), ruthenium (Ru), platinum (Pt), silver (Ag), gold (Au), copper (Cu), tin (Sn), indium (In), conductive carbon, or combinations thereof.

In an example, the semiconductor package 1 may further include a capping insulating layer 9 on the substrate 3. The capping insulating layer 9 may cover the pad patterns 6, on the substrate 3. The capping insulating layer 9 may include first capping openings 9a exposing portions of the first signal pads 6s1, and second capping openings 9b exposing portions of the second signal pads 6s2, respectively. A first capping opening 9a may expose a portion of a respective first signal pad 6s1, and a second capping opening 9b may expose a portion of a respective second signal pad 6s2. Accordingly, the first and second signal pads 6s1 and 6s2 may be partially covered by the capping insulating layer 9.

The capping insulating layer 9 may include a first capping insulating layer 11 and a second capping insulating layer 13, which may be sequentially stacked. The first and second capping insulating layers 11 and 13 may include different materials. For example, the first capping insulating layer 11 may include silicon oxide or an oxide-based insulating material, and the second capping insulating layer 13 may include silicon nitride or silicon oxynitride.

In some example embodiments, the thickness of the capping insulating layer 9 may be greater than the thickness of each of the pad patterns 6.

In some example embodiments, the thickness of at least one of the first and second capping insulating layers 11 and 13 may be greater than the thickness of each of the pad patterns 6.

The pillars 18 may include first signal pillars 18a on the first signal pads 6s1 and second signal pillars 18b on the second signal pads 6s2. The first signal pillars 18a may contact the first signal pads 6s1, respectively, and the second signal pillars 18b may contact the second signal pads 6s2, respectively.

In some example embodiments, the pillars 18 may further include one or more first dummy pillars 18d1 and one or more second dummy pillar 18d2. The first and second dummy pillars 18d1 and 18d2 may be on the capping insulating layer 9. The first and second dummy pillars 18d1 and 18d2 may be spaced apart from the pad patterns 6. The first and second dummy pillars 18d1 and 18d2 may be electrically isolated.

Hereinafter, description of one of the first signal pads 6s1, one of the second signal pads 6s2, one of the first signal pillars 18a, and one of the second signal pillars 18b will be provided, with the understanding that the description is applicable to each of the first signal pads 6s1, second signal pads 6s2, first signal pillars 18a, and second signal pillars 18b, as the case may be.

As best seen in FIG. 2A, the first signal pillar 18a may include a lower portion that is within the first capping opening 9a and an upper portion tb1 that is positioned on a level higher than the capping insulating layer 9. In the first signal pillar 18a, the upper portion tb1 positioned at a higher height level (e.g., may be located farther from the substrate 3) than the capping insulating layer 9, and the upper portion tb1 may have a width greater than that of the lower portion that is within the first capping opening 9a.

The passivation layer 15 may have a plurality of openings, including a plurality of first openings 15a, at least one second opening 15b, and a plurality of dummy openings 15a'. As best seen in FIGS. 1 and 2A, one first opening 15a may have a sidewall that faces and surrounds the side surface of the first signal pillar 18a arranged therein. As best seen in FIGS. 1 and 2B, one second opening 15b may have a sidewall that faces and surrounds the side surface of the one or more pillars arranged therein, which may include one or more second signal pillars 18b and one or more second dummy pillars 18d2. As best seen in FIGS. 1 and 2C, one dummy opening 15a' may have a sidewall that faces and surrounds the side surface of a first dummy pillar 18d1 arranged therein. The first openings 15a and the dummy openings 15a' may have the same size.

In some example embodiments, the openings 15a, 15b and 15a' of the passivation layer 15 may have inclined sidewalls. In some example embodiments, the openings 15a, 15b and 15a' of the passivation layer 15 may have substantially vertical sidewalls.

In some example embodiments, each first signal pillar 18a may be located in a respective first opening 15a. Each first dummy pillar 18d1 may be located in a respective dummy opening 15a'.

In some example embodiments, a plurality of pillars 18 may be within one second opening 15b. In some embodiments, at least one of the pillars 18 may be a second signal pillar 18b. In some embodiments, at least one of the pillars 18 may be a second dummy pillar 18d2

In some example embodiments, the pad patterns 6 may include a first adjacent pattern 6d1 (as best seen in FIG. 2A) adjacent to the first signal pad 6s1, and a second adjacent pattern 6d2 (as best seen in FIG. 2B) adjacent to the second signal pad 6s2.

In some example embodiments, the first adjacent pattern 6d1 may overlap or may be overlapped by the passivation layer 15 in a vertical direction.

In some example embodiments, at least a portion of the second adjacent pattern 6d2 may not overlap or may not be overlapped by the passivation layer 15.

The first opening 15a and the second opening 15b may have different sizes and/or different widths. For example, the size of the second opening 15b may be greater than the size of the first opening 15a. A maximum width of the second opening 15b may be greater than a maximum width of the first opening 15a.

In the first opening 15a, the width thereof in a first horizontal direction X and a width thereof in a second horizontal direction Y may be substantially the same. The first and second horizontal directions X and Y may be perpendicular to each other.

In the second opening 15b, at least one of a width thereof in the first horizontal direction X and a width thereof in the first horizontal direction X may be greater than the maximum width of the first opening 15a.

In some example embodiments, in the second opening 15b, the width thereof in the first horizontal direction X and the width thereof in the second horizontal direction Y may be different.

In some example embodiments, a minimum distance between the sidewall of the second opening 15b and the side surface of a second signal pillar 18b arranged within the second opening 15b may be greater than a maximum distance between the sidewall of the first opening 15a and the side surface of the first signal pillar 18a arranged within the first opening 15a.

In some example embodiments, a minimum distance between the side surface of the second signal pillar 18b within the second opening 15b and the sidewall of the second opening 15b in one of the first and second horizontal directions X and Y may be about 5 μm, and a minimum distance between the side surface of the second signal pillar 18b within the second opening 15b and the sidewall of the second opening 15b in the other horizontal direction may be about 30 μm.

The sidewall of the first opening 15a may be spaced apart from the side surface of the first signal pillar 18a arranged therein at substantially the same distance in the first horizontal direction X and the second horizontal direction Y. The sidewall of the second opening 15b may be spaced apart from the side surface of a second signal pillar 18b arranged therein at different distances in the first horizontal direction X and the second horizontal direction Y.

As best seen in FIG. 1, the passivation layer 15 may include a first portion 15L having a line-shaped side surface extending in the first horizontal direction X or the second horizontal direction Y, and one or more second portions 15P that extend into the second opening 15b from the side surface of the first portion 15L. For example, the passivation layer 15 may include the first portion 15L having a line-shaped side surface extending in the first horizontal direction X, and a second portion 15P extending from the first portion 15L into the second opening 15b in the second horizontal direction Y. The passivation layer 15 may include the first portion 15L having a line-shaped side surface extending in the second horizontal direction Y, and the second portion 15P extending from the first portion 15L into the second opening 15b in the first horizontal direction X.

The second portion 15P may face the second dummy pillar 18d2. More specifically, in some embodiments, the side surface of the second portion 15P that is parallel with the line-shaped side surface of the first portion 15L from which the second portion extends may face the second dummy pillar 18d2.

The passivation layer 15 may include polyimide, however the present disclosure is not limited thereto. For example, the passivation layer 15 may include an organic insulating material, for example, at least one of epoxy, benzocyclobutene (BCB), and polybenzoxazole (PBO).

In some example embodiments, the pillars 18 may include lower layers 20a, 20b, 20c and 20d and metal patterns 22a, 22b, 22c, 22d stacked sequentially, respectively. The first signal pillar 18a may include lower layer 20a and metal pattern 22a, the second signal pillar 18b may include lower layer 20b and metal pattern 22b, the first dummy pillar 18d1 may include lower layer 20c and metal pattern 22c, and the second dummy pillar 18d2 may include lower layer 20d and metal pattern 22d.

In some example embodiments, the lower layers 20a, 20b, 20c and 20d may include first layers 20a_1, 20b_1, 20c_1 and 20d_1, and second layers 20a_2, 20b_2, 20c_2 and 20d_2, which are sequentially stacked, respectively. The first layers 20a_1, 20b_1, 20c_1 and 20d_1 may each include a Ti layer, and the second layers 20a_2, 20b_2, 20c_2 and 20d_2 may each include a Cu seed layer.

In some example embodiments, side surfaces of the lower layers 20a, 20b, 20c, and 20d may be more recessed (e.g., farther from the passivation layer 15) than side surfaces of the metal patterns 22a, 22b, 22c, and 22d. Therefore, in the pillars 18, undercut regions below the metal patterns 22a, 22b, 22c, and 22d, which are formed by recessed side surfaces of the lower layers 20a, 20b, 20c, and 20d may be formed, respectively.

In some example embodiments, in the respective pillars 18 (that is, in the first signal pillars 18a, second signal pillars 18b, first dummy pillars 18d1, and second dummy pillars 18d2, respectively), the metal patterns 22a, 22b, 22c, and 22d may include first metal layers 24a, 24b, 24c, and 24d, second metal layers 26a, 26b, 26c, and 26d, and third metal layers 28a, 28b, 28c, and 28d, respectively.

The second metal layers 26a, 26b, 26c, 26d and the third metal layers 28a, 28b, 28c, 28d may have substantially the same width.

The first metal layers 24a, 24b, 24c, and 24d may have inclined side surfaces. For example, the first metal layer 24a, 24b, 24c, 24d may have an inclined side surface in such a manner that the width thereof in the region adjacent to the lower layer 20a, 20b, 20c, 20d is less than the width thereof in the region adjacent to the second metal layer 26a, 26b, 26c, 26d.

The first metal layers 24a, 24b, 24c and 24d may include Cu. For example, the first metal layers 24a, 24b, 24c and 24d may include Cu by an electroplating method.

The second metal layers 26a, 26b, 26c, and 26d may be barrier layers. The second metal layers 26a, 26b, 26c, and 26d may include Cu, Co, Ni, or combinations thereof. The second metal layers 26a, 26b, 26c, and 26d may include a material different from that of the first metal layers 24a, 24b, 24c, and 24d. For example, the second metal layers 26a, 26b, 26c, and 26d may include Ni. The third metal layers 28a, 28b, 28c, and 28d may include Cu or CuSn.

The connection patterns 30 may contact upper surfaces 18u of the pillars 18, respectively. For example, a first connection pattern 30a may contact an upper surface of the first signal pillar 18a, a second connection pattern 30b may contact an upper surface of the second signal pillar 18b, a first dummy connection pattern 30d1 may contact an upper surface of the first dummy pillar 18d1, and a second dummy connection pattern 30d2 may contact an upper surface of the second dummy pillar 18d2. The connection patterns 30 (30a, 30b, 30d1 and 30d2) may include a solder material. For example, the connection patterns 30 may include SnAg or SaAgCu. In some example embodiments, a maximum width W1 of each of the pillars 18 may be about 25 μm to about 35 μm. In some example embodiments, a maximum width W1 of each of the pillars 18 may be about 30 μm.

In some example embodiments, a thickness of each of the pillars 18 located above the capping insulating layer 9 may be about 17 μm to about 23 μm. In an example, a thickness of each of the pillars 18 located above the capping insulating layer 9 may be about 20 μm.

The first metal layer 24a, 24b, 24c, 24d may have a first thickness T1 on the capping insulating layer 9, the second metal layer 26a, 26b, 26c, 26d may have a second thickness T2, and the third metal layer 28a, 28b, 28c, 28d may have a third thickness T3.

The first thickness T1 may be greater than the second thickness T2. The second thickness T2 may be greater than the third thickness T3. The third thickness T3 may be greater than the thickness of each of the lower layers 20a, 20b, 20c, and 20d.

In some example embodiments, the first thickness T1 may be about 15 μm, the second thickness T2 may be about 3 μm, and the third thickness T3 may be about 2 μm.

A thickness ta1 of the passivation layer 15 may be less than a thickness of each of the pillars 18. In some example embodiments, the thickness ta1 of the passivation layer 15 may be less than the first thickness T1. In some example embodiments, the thickness ta1 of the passivation layer 15 may be greater than the second thickness T2. In some example embodiments, the thickness ta1 of the passivation layer 15 may be greater than the third thickness T3. In some example embodiments, the thickness ta1 of the passivation layer 15 may be from about 4 μm to about 7 μm.

In a portion of the first signal pillar (18a in FIG. 2A) that does not overlap (or is not overlapped by) the capping insulating layer 9, a first center 18c1 between an upper surface 18u and a lower surface 18L in contact with the first signal pad 6s1 may be positioned on a level higher than an upper surface 15u of the passivation layer 15 when viewed with respect to the substrate 3.

A distance between the first center 18c1 of the portion of the first signal pillar (18a in FIG. 2A) that does not overlap with the capping insulating layer 9, and the upper surface of the first signal pad 6s1, may be greater than a distance between the upper surface 15u of the passivation layer 15 and the upper surface of the first signal pad 6s1.

In the upper portion tb1 of the first signal pillar (18a in FIG. 2A) that overlaps with the capping insulating layer 9, a second center 18c2 between the upper surface 18u of the upper portion tb1 and the lower surface thereof in contact with the upper surface of the capping insulating layer 9 may be positioned on a level higher than the upper surface 15u of the passivation layer 15.

The distance between the second center 18c2 of the upper portion tb1 of the first signal pillar (18a in FIG. 2A) overlapping the capping insulating layer 9, and the upper surface of the first signal pad 6s1, may be greater than the distance between the upper surface 15u of the passivation layer 15 and the upper surface of the first signal pad 6s1.

In some example embodiments, the second opening 15b of the passivation layer 15 may be an area for a Bump Shear Test (BST). For example, the second opening 15b of the passivation layer 15 may expose the second signal pillar 18b for the BST test, among the plurality of pillars 18. The BST test may be performed on the second signal pillar 18b. For example, while moving the tip for the BST test in the first horizontal direction X or the second horizontal direction Y, the second signal pillar 18b is physically pushed by the tip, thereby measuring adhesive force of the second signal pillar 18b.

The relatively large second opening 15b may provide a space for more precisely and accurately performing the BST test for the second signal pillar 18b, and pillars 18a and 18d1 that are not subjected to the BST test and are within the relatively small first opening 15a may be protected by the passivation layer 15.

In some example embodiments, the relatively protruding second portion (15P in FIG. 1) of the passivation layer 15 may serve to distinguish the second dummy pillar 18d2 and the second signal pillar 18b disposed in the second opening 15b during the BST test. Accordingly, among the plurality of pillars 18 disposed in the second opening 15b, a pillar facing the second portion (15P of FIG. 1) of the passivation layer 15 may be classified as a dummy pillar 18d2, and the remaining pillars may be classified as the signal pillar 18b that requires the BST test. Therefore, the relatively protruding second portion (15P in FIG. 1) of the passivation layer 15 may help to more efficiently conduct the BST test.

A semiconductor package according to some example embodiments will now be described with reference to FIGS. 3A to 3D. In FIGS. 3A to 3D, FIG. 3A may be a cross-sectional view corresponding to FIG. 2A, FIG. 3B may be a cross-sectional view corresponding to FIG. 2B, FIG. 3C may be a cross-sectional view corresponding to FIG. 2C, and FIG. 3D may be a cross-sectional view corresponding to FIG. 2D.

Referring to FIGS. 3A to 3D, a substrate 103 corresponding to the above-described substrate (FIGS. 1 and 2A to 2D) may be provided.

Pad patterns 106 may be arranged on the substrate 103. The pad patterns 106 may include a first signal pad 106s1 and a second signal pad 106s2.

The first signal pad 106s1 may have substantially the same thickness and the same structure as the first signal pad 6s1 of FIG. 2A, and the second signal pad 106s2 may have substantially the same thickness and the same structure as the second signal pad 6s2 of FIG. 2B.

A capping insulating layer 109 surrounding side surfaces of the pad patterns 106 may be arranged on the substrate 103.

A plurality of pillars 118a, 118b, 118d1, and 118d2 may be arranged on the substrate 103. A plurality of connection patterns 130a, 130b, 130c, and 130d may be arranged on the plurality of pillars 118a, 118b, 118d1, and 118d2.

The plurality of pillars 118a, 118b, 118d1, and 118d2 may include lower layers 120a, 120b, 120c, and 120d, and metal patterns 122a, 122b, 122c and 122d on the lower layers 120a, 120b, 120c, and 120d, respectively.

The lower layers 120a, 120b, 120c, and 120d may be formed of substantially the same material and the same thickness as the lower layers (20a, 20b, 20c, 20d of FIGS. 2A to 2D) described above. For example, the lower layer 120a, 120b, 120c, 120d may include first layer 120a_1, 120a_2, 120a_3, 120a_4, and second layer 120b_1, 120b_2, 120b_3, 120b_4, which are sequentially stacked. The first layer 120a_1, 120a_2, 120a_3, 120a_4 may include a Ti layer, and the second layer 120b_1, 120b_2, 120b_3, 120b_4 may include a Cu seed layer.

The metal patterns 122a, 122b, 122c, and 122d may be formed of substantially the same material or the same metal layers as the metal patterns (22a, 22b, 22c, and 22d of FIGS. 2A to 2D) described above, respectively.

Each of the plurality of pillars 118a, 118b, 118d1, and 118d2 may have a thickness of about 20 μm.

The width of each of the plurality of pillars 118a, 118b, 118d1, and 118d2 may be about 20 μm.

The plurality of pillars may include a first signal pillar 118a, a second signal pillar 118b, a first dummy pillar 118d1, and a second dummy pillar 118d2. The first signal pillar 118a may contact a portion of the first signal pad 106s1, and the second signal pillar 118b may contact a portion of the second signal pad 106s2. The first and second dummy pillars 118*d*1 and 118*d*2 may be electrically isolated. The first and second dummy pillars 118*d*1 and 118*d*2 may contact the capping insulating layer 109.

On the substrate 103, a passivation layer 115 having a plurality of openings 115*a*, 115*b* and 115*a*' may be disposed. The passivation layer 115 may have substantially the same thickness (ta2) and the same structure as the passivation layer (15 in FIGS. 1 and 2A to 2D) described above. Accordingly, the openings in the passivation layer 115 may include one or more first openings 115*a* in FIG. 3A, substantially identical to the first openings (15*a* in FIGS. 1 and 2A) described above, at least one second opening 115*b* in FIGS. 3B and 3D, substantially the same as the second opening (15*b* in FIGS. 1, 2B and 2D) described above, and one or more dummy openings 115*a*' in FIG. 3C, substantially the same as the dummy openings (15*a*' in FIGS. 1 and 2C) described above.

In some example embodiments, the openings 115*a*, 115*b*, and 115*a*' of the passivation layer 115 may have inclined sidewalls.

In another example, the openings 115*a*, 115*b* and 115*a*' of the passivation layer 115 may have substantially vertical sidewalls.

The first opening (115*a* of FIG. 3A) may expose a portion of the first signal pad 106*s*1. The second opening (115*b* of FIG. 3B) may expose the entire upper surface of the second signal pad 106*s*2.

Figure 3A:
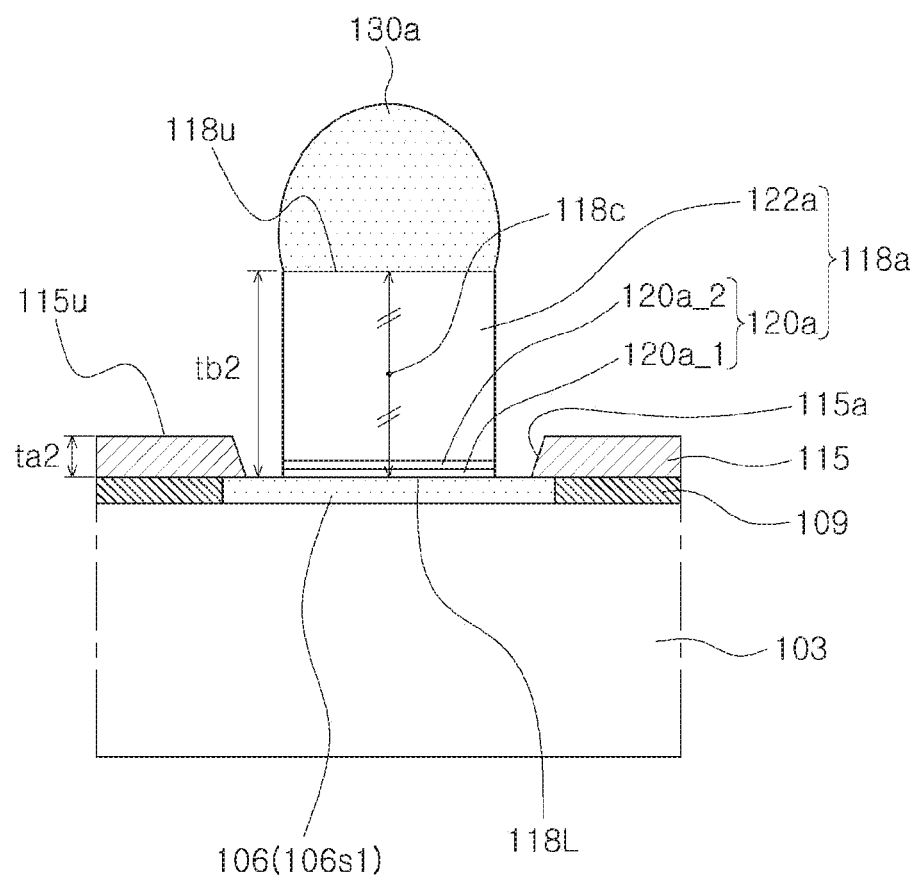
FIGS. 3A to 3D are schematic cross-sectional views illustrating a modified example of a semiconductor package according to some example embodiments.
Figure 3B:
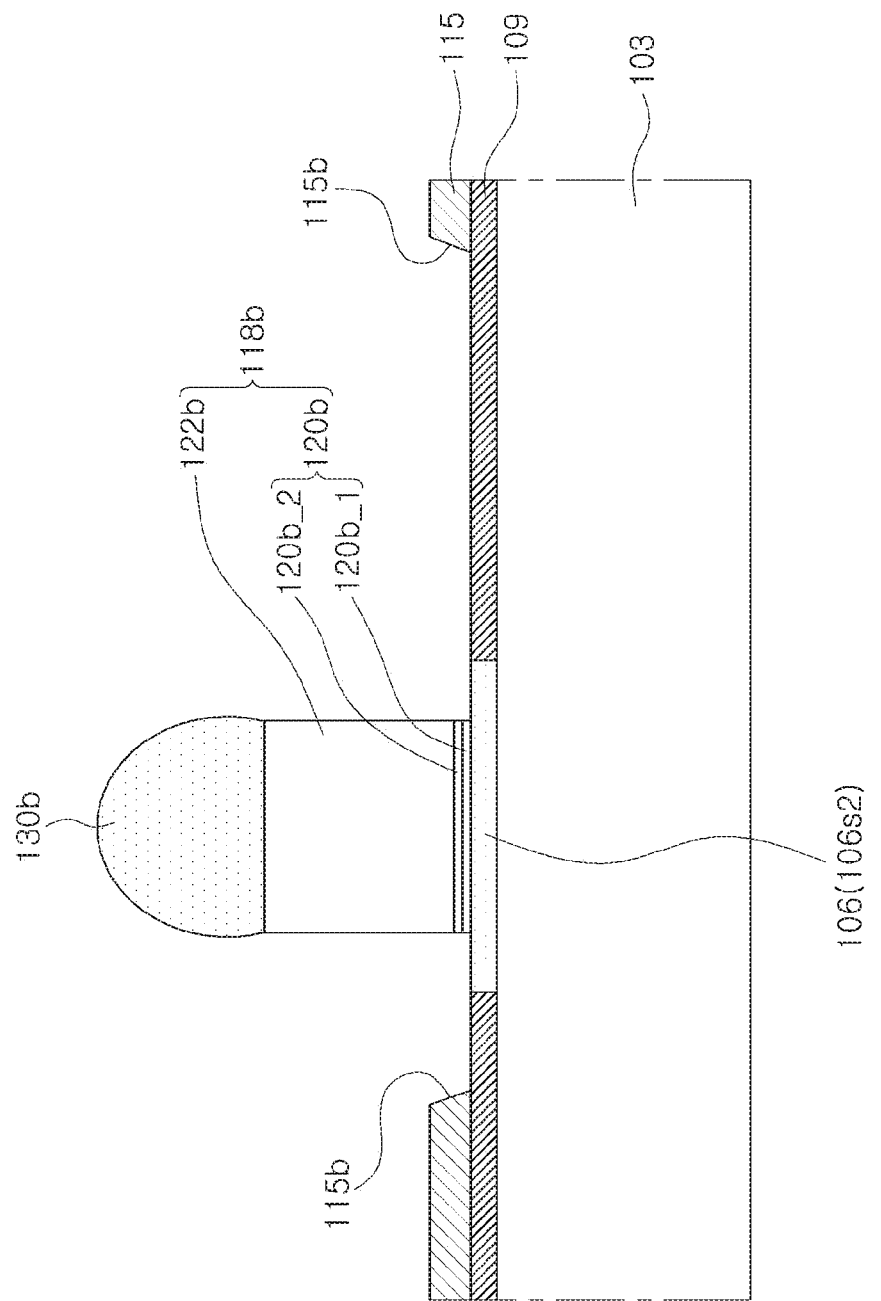
Figure 3C:
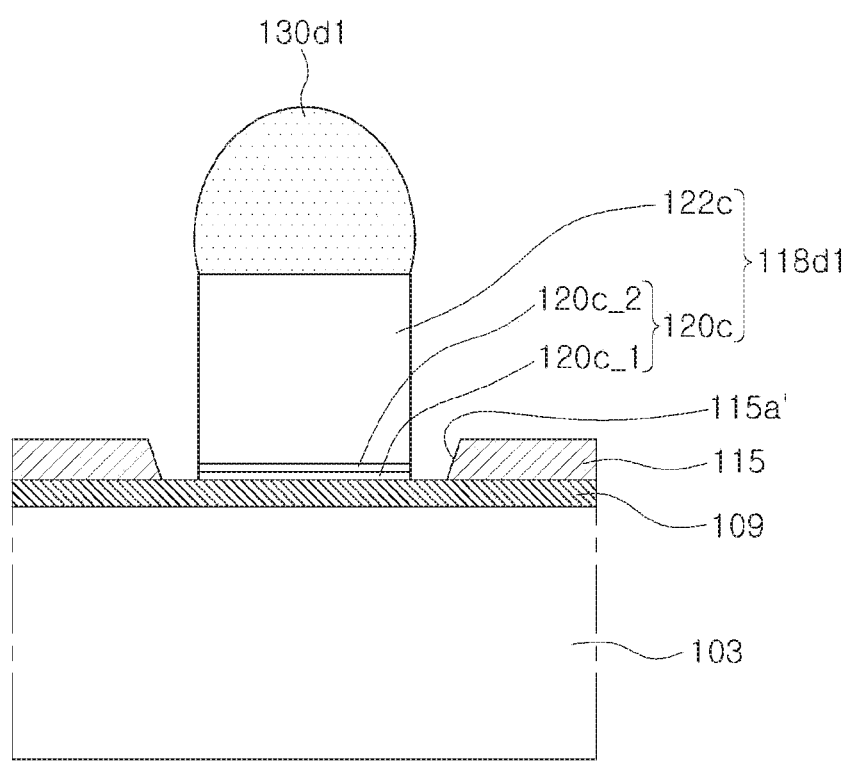
Figure 3D:
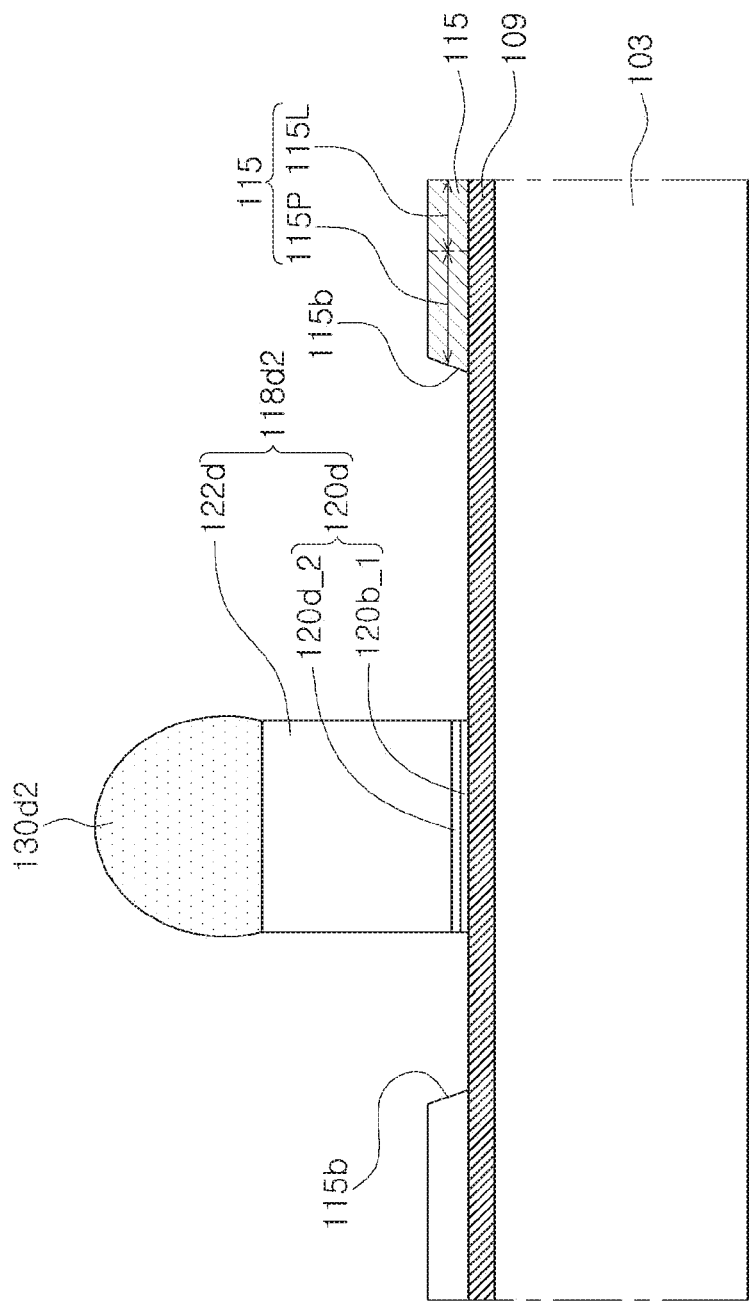

Similar to the first opening 15*a* (in FIGS. 1 and 2A) described above, the first signal pillar 118*a* may be disposed in the first opening 115*a* (in FIG. 3A). Similar to the above-described second opening 15*b* (in FIGS. 1, 2B and 2D), the second signal pillar 118*b* and the second dummy pillar 118*d*2 may be disposed in the second opening 115*b* (in FIGS. 3B and 3D). The first dummy pillar 118*d*1 may be disposed in the dummy opening 115*a*' (in FIG. 3C), similar to the dummy opening 15*a*' (in FIGS. 1 and 2C) described above.

When viewed from the upper surface of the substrate 103 or the upper surface of each of the pad patterns 106 as a reference, the center 118*c* (in FIG. 3A) between the upper surface 118*u* and the lower surfaces 118L of each of the plurality of pillars 118*a*, 118*b*, 118*d*1 and 118*d*2 nay be positioned on a level higher than the upper surface 115*u* of the passivation layer 115.

Figure 4A:
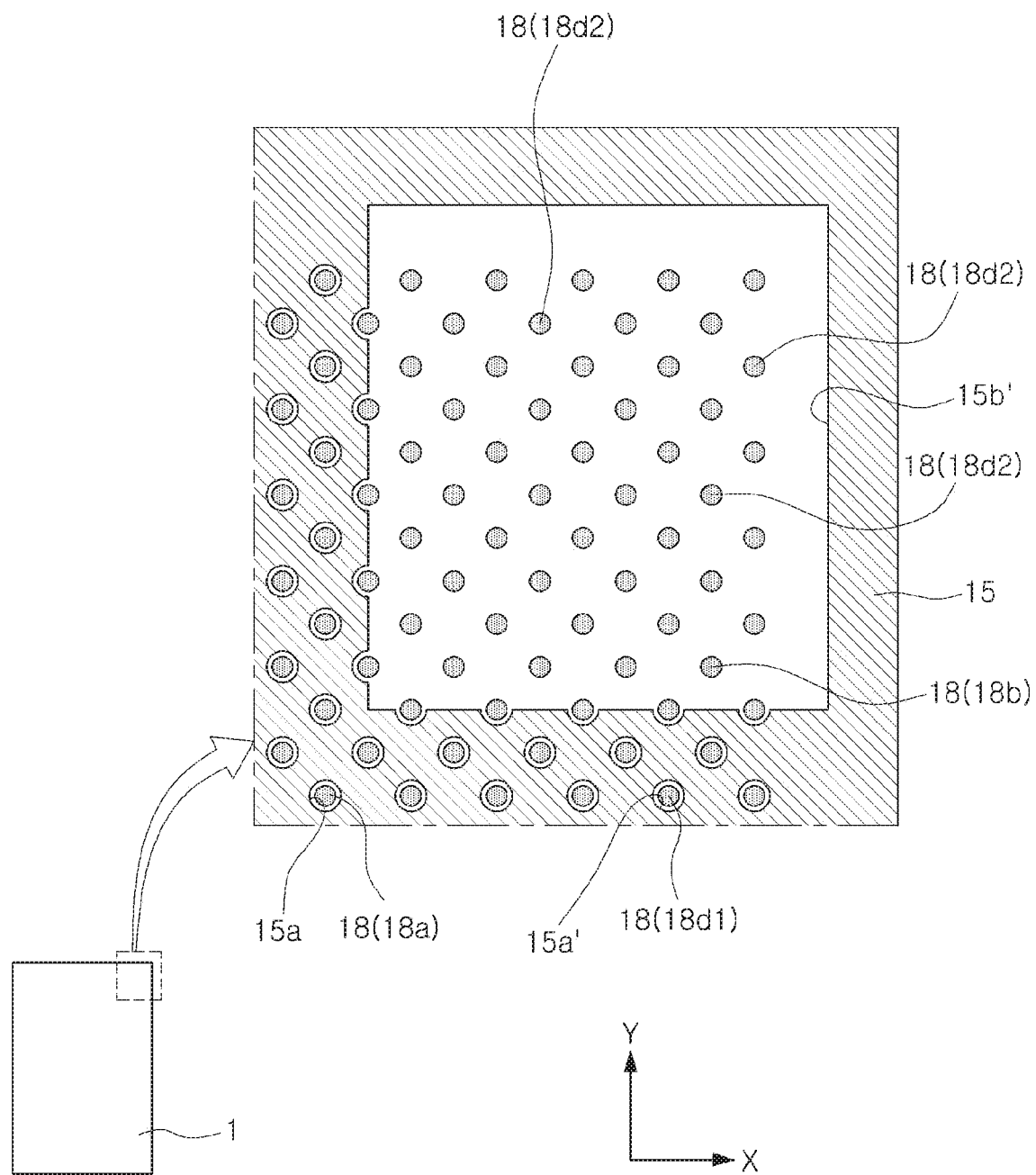
FIGS. 4A and 4B are schematic plan views illustrating modified examples of semiconductor packages according to some example embodiments.
Figure 4B:
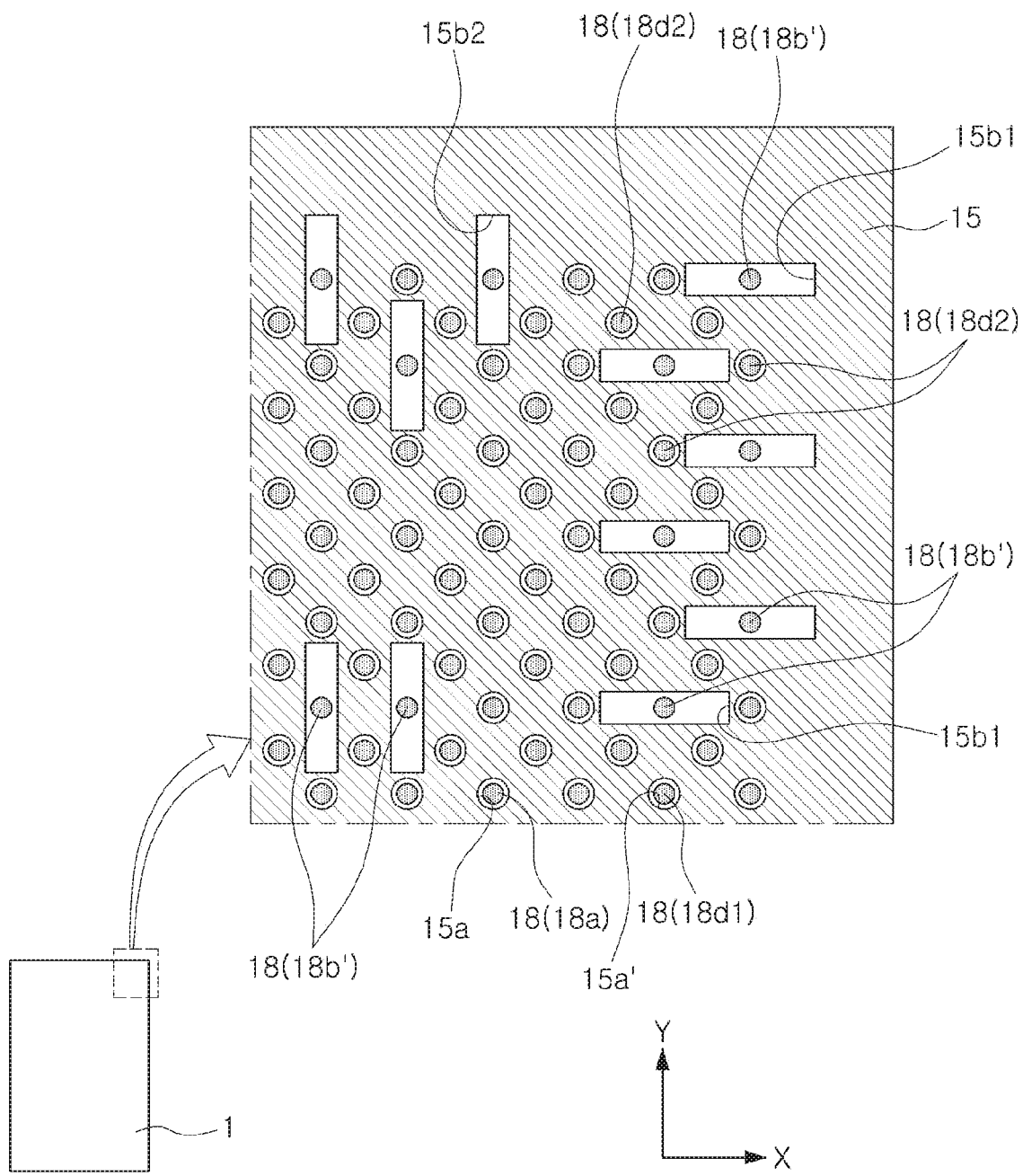

FIGS. 4A and 4B are schematic plan views illustrating a semiconductor package according to some example embodiments. Referring to FIGS. 4A and 4B, examples of the second opening 15*b* of the passivation layer 15 of FIG. 1 will be described.

The second opening 15*b* of the passivation layer 15 of FIG. 1 may be formed to have a shape formed when a line portion parallel to one edge and a line portion parallel to the other edge of the semiconductor package 1 meet, and for example, may have a substantially "L" shape or "¬" shape. However, the shape of the second opening 15*b* of the passivation layer 15 according to some example embodiments is not limited thereto.

In some example embodiments, the shape of the second opening (15*b* in FIG. 1) of the passivation layer 15 as in FIG. 1 may be replaced by a quadrangular shape 15*b*' as in FIG. 4A.

In some example embodiments, the shape of the second opening 15*b* (in FIG. 1) of the passivation layer 15 as in FIG. 1 may be replaced by a second opening 15*b*1 (in FIG. 4B) elongated in the first vertical direction X as in FIG. 4B and/or a second opening 15*b*2 (in FIG. 4B) elongated in the second vertical direction Y. The second signal pillars 18*b*' may be arranged inside the second opening 15*b*1 (in FIG. 4B) elongated in the first vertical direction X and/or the second opening 15*b*2 (in FIG. 4B) elongated in the second vertical direction (Y) as in FIG. 4B.

Figure 5:
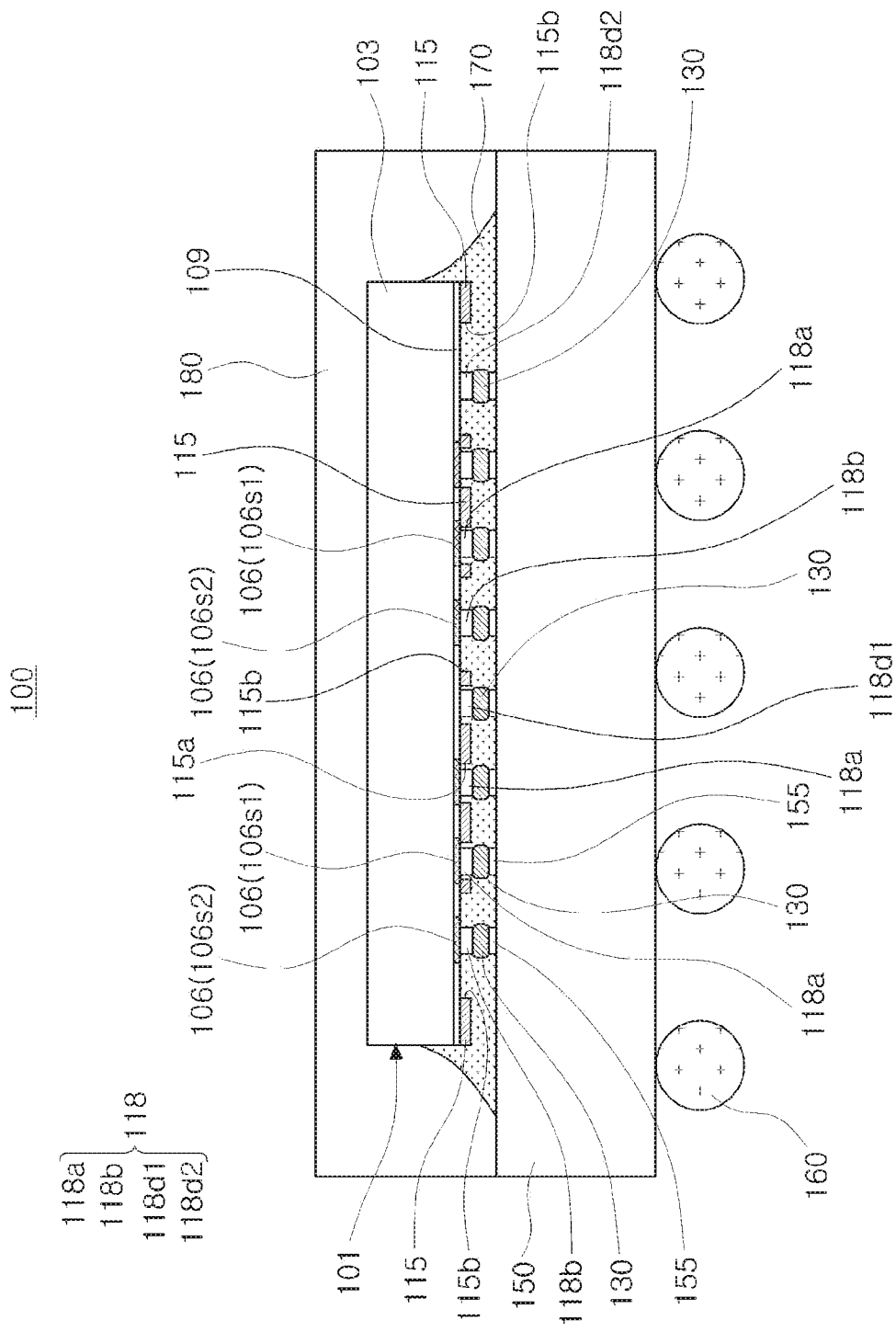
FIG. 5 is a schematic cross-sectional view illustrating an example of a semiconductor package according to some example embodiments.

Referring to FIG. 5, a semiconductor package according to some example embodiments will be described. FIG. 5 is a schematic cross-sectional view illustrating a semiconductor package according to some example embodiments.

Referring to FIG. 5, a semiconductor package 100 in some example embodiments may include a base 150, a first chip 101 on the base 150, first connection patterns 130 connecting the first chip 101 and the base 150, and second connection patterns 160 below the base 150.

In some example embodiments, the base 150 may be an interposer or a package substrate.

In some example embodiments, the base 150 may be a lower semiconductor chip or a lower semiconductor package.

In an example, the first chip 101 may include the substrate 103, the capping insulating layer 109, the pad patterns 106, and the plurality of pillars 118, and the passivation layer 115 having the plurality of openings 115*a* and 115*b*, which are the same as those described with reference to FIGS. 3A to 3D.

The connection patterns 130 may contact the plurality of pillars 118 of the first chip 101 and upper pads 155 of the base 150.

In some example embodiments, the semiconductor package 100 may further include an underfill material layer 170 filling between the base 150 and the first chip 101 and covering at least a portion of a side surface of the first chip 101. The underfill material layer 170 may surround side surfaces of the connection patterns 130 and fill the plurality of openings 115*a* and 115*b* of the passivation layer 115.

In some example embodiments, the semiconductor package 100 may further include a mold layer 180 covering the first chip 101, on the base 150.

In some example embodiments, the substrate 103, the capping insulating layer 109, the pad patterns 106, the plurality of pillars 118, and the passivation layer 115 having the plurality of openings 115*a* and 115*b*, included in the first chip 101, may also be replaced with the substrate 3, the capping insulating layer 9, and the pad patterns 6, the plurality of pillars 18, and the passivation layer 15 having the plurality of openings 15*a* and 15*b*, respectively, as described with reference to FIGS. 1 and 2A to 2D.

The description of the first chip 101 may be easily understood from the contents described with reference to FIGS. 1 and 2A to 2D and/or the contents described with reference to FIGS. 3A to 3D, and thus detailed description thereof will be omitted.

Figure 6:
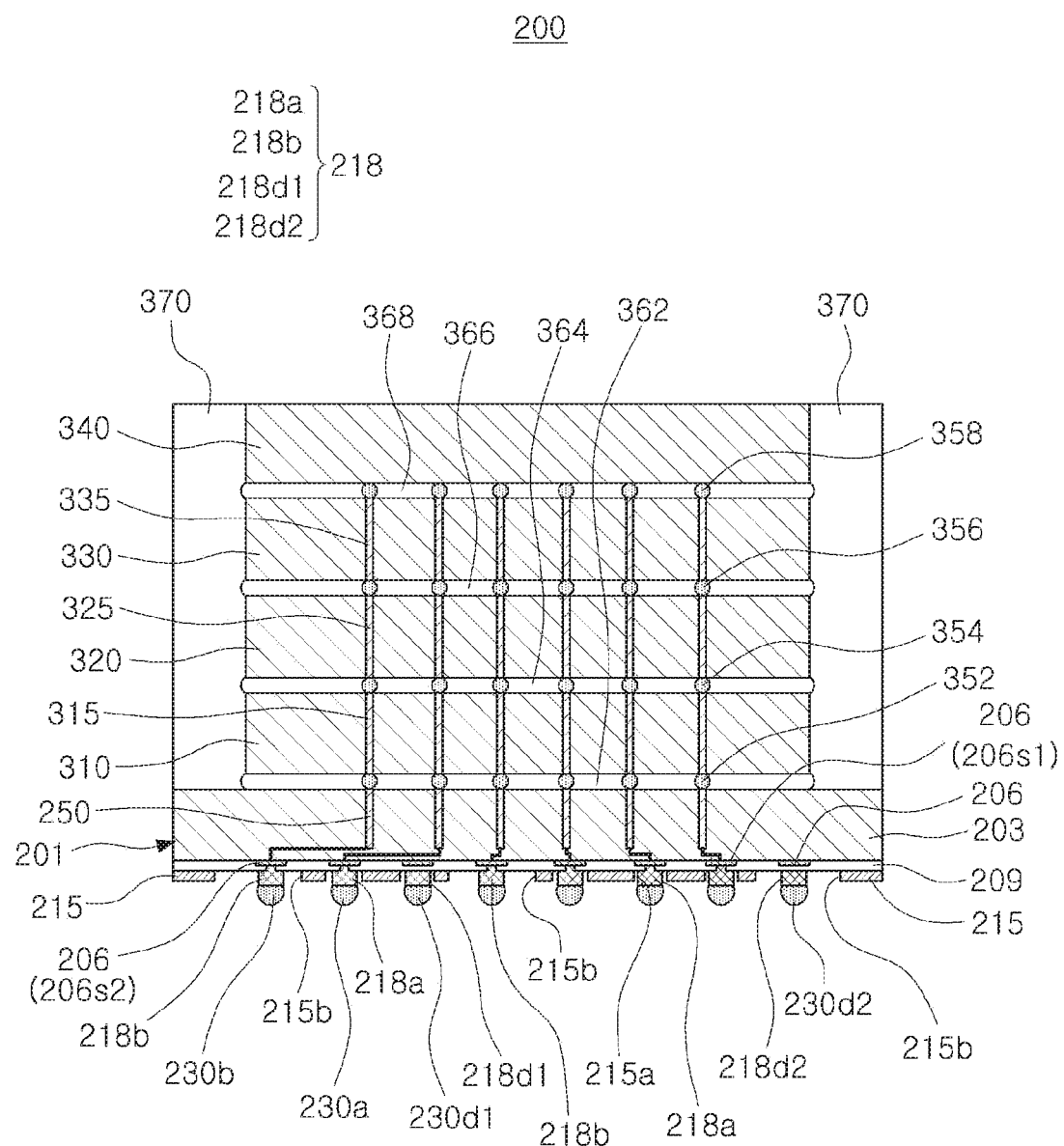
FIG. 6 is a schematic cross-sectional view illustrating an example of a semiconductor package according to some example embodiments.

A semiconductor package according to some example embodiments will be described with reference to FIG. 6. FIG. 6 is a schematic cross-sectional view illustrating an example of a semiconductor package according to some example embodiments.

Referring to FIG. 6, a first semiconductor package 200 in some example embodiments may include a first chip 201, second chips 310, 320, 330 and 340 stacked in sequence on the first chip 201, intermediate connection bumps 354, 356 and 358, which may couple second chips adjacent to each other among the second chips 310, 320, 330 and 340, and lower connection bumps 352, which may couple a lowest second chip 310 among the second chips 310, 320, 330 and 340 with the first chip 201.

In some example embodiments, the first semiconductor package 200 may further include a first underfill material layer 362 filling between the lowest second chip 310 and the first chip 201, and second underfill material layers 364, 366 and 368 filling between second chips adjacent to each other among the second chips 310, 320, 330 and 340.

In some example embodiments, the first semiconductor package 200 may further include a first mold layer 370 covering side surfaces of the second chips 310, 320, 330 and 340, on the first chip 201.

With reference to FIGS. 5, 1, and 2A to 2D, the first chip 201 may include the substrate 3, the capping insulating layer 9, the pad patterns 6, the plurality of pillars 18, the passivation layer 15 having the plurality of openings 15a and 15b, 15a', and a substrate 203 that may respectively correspond to the connection patterns 30. The first chip 201 may also include a capping insulating layer 209, pad patterns 206, a plurality of pillars 218a, 218b, 218d1 and 218d2, a passivation layer 215 having a plurality of openings 215a, 215b, and connection patterns 230a, 230b, 230d1 and 230d2.

The description of the first chip 201 may be easily understood from the contents described with reference to FIGS. 1 and 2A to 2D, and thus, detailed descriptions thereof will be omitted.

In some example embodiments, the first chip 201 may be replaced with the first chip 101 described in FIG. 5.

The connection patterns 230a, 230b, 230d1 and 230d2 may be referred to as first connection patterns. The width of each of the lower and intermediate connection bumps 352, 354, 356, and 358 may be less than the width of each of the first connection patterns 230a, 230b, 230d1, and 230d2. The thickness of each of the intermediate and lower connection bumps 352, 354, 356, and 358 may be less than the thickness of each of the first connection patterns 230a, 230b, 230d1, and 230d2. The width of each of the intermediate and lower connection bumps 352, 354, 356, and 358 may be less than the width of each of the plurality of pillars 218a, 218b, 218d1, and 218d2.

Through-electrodes 315, 325, and 335 may be arranged inside the second chips 310, 320, and 330 below an uppermost second chip 340 among the second chips 310, 320, 330 and 340. The through-electrodes 315, 325, and 335 may electrically connect the second chips 310, 320, 330 and 340 and the first chip 201.

In the first chip 201, the substrate 203 may include an internal wiring 250. The internal wiring 250 may be electrically connected to signal pads 206s1 and 206s2 among the plurality of pad patterns 206. Among the plurality of pillars 218a, 218b, 218d1, and 218d2, signal pillars 218a and 218b may be electrically connected to the internal wiring 250 through the signal pads 206s1 and 206s2, and dummy pillars 218d1 and 218d2 may be electrically insulated from the internal wiring 250.

In some example embodiments, the first chip 210 may be or a logic semiconductor chip or a buffer semiconductor chip including a semiconductor integrated circuit and/or an SRAM memory cell. The first chip 210 may be a controller semiconductor chip that controls operations such as input/output of the second chips 310, 320, 330 and 340.

In some example embodiments, the number of the second chips 310, 320, 330 and 340 is not limited to the number illustrated in the drawings. For example, two second chips or more than four second chips may be disposed on the first chip 210.

In some example embodiments, the second chips 310, 320, 330 and 340 may be two chips or more than four chips.

In some example embodiments, the second chips 310, 320, 330 and 340 may be volatile memory semiconductor chips such as DRAM or nonvolatile memory semiconductor chips such as NAND flash. The types of semiconductor chips of the second chips 310, 320, 330 and 340 are not limited to the above-described DRAM or NAND flash. For example, the second chips 310, 320, 330 and 340 may be PRAM, ReRAM, or MRAM.

In some example embodiments, the second chips 310, 320, 330 and 340 may include different types of memory semiconductor chips. For example, the second chips 310, 320, 330 and 340 may include at least two or more of DRAM, NAND flash, PRAM, ReRAM), and MRAM.

In some example embodiments, the second chips 310, 320, 330 and 340 may include different types of semiconductor chips. For example, any one of the second chips 310, 320, 330 and 340 may be a logic semiconductor chip or a processor chip, and one or a plurality of chips among the remaining chips may be a memory semiconductor chip. For example, the second chips 310, 320, 330 and 340 may include a lower chip, which may be a logic semiconductor chip or a processer chip, and one or a plurality of memory semiconductor chips disposed on the lower chip.

Figure 7:
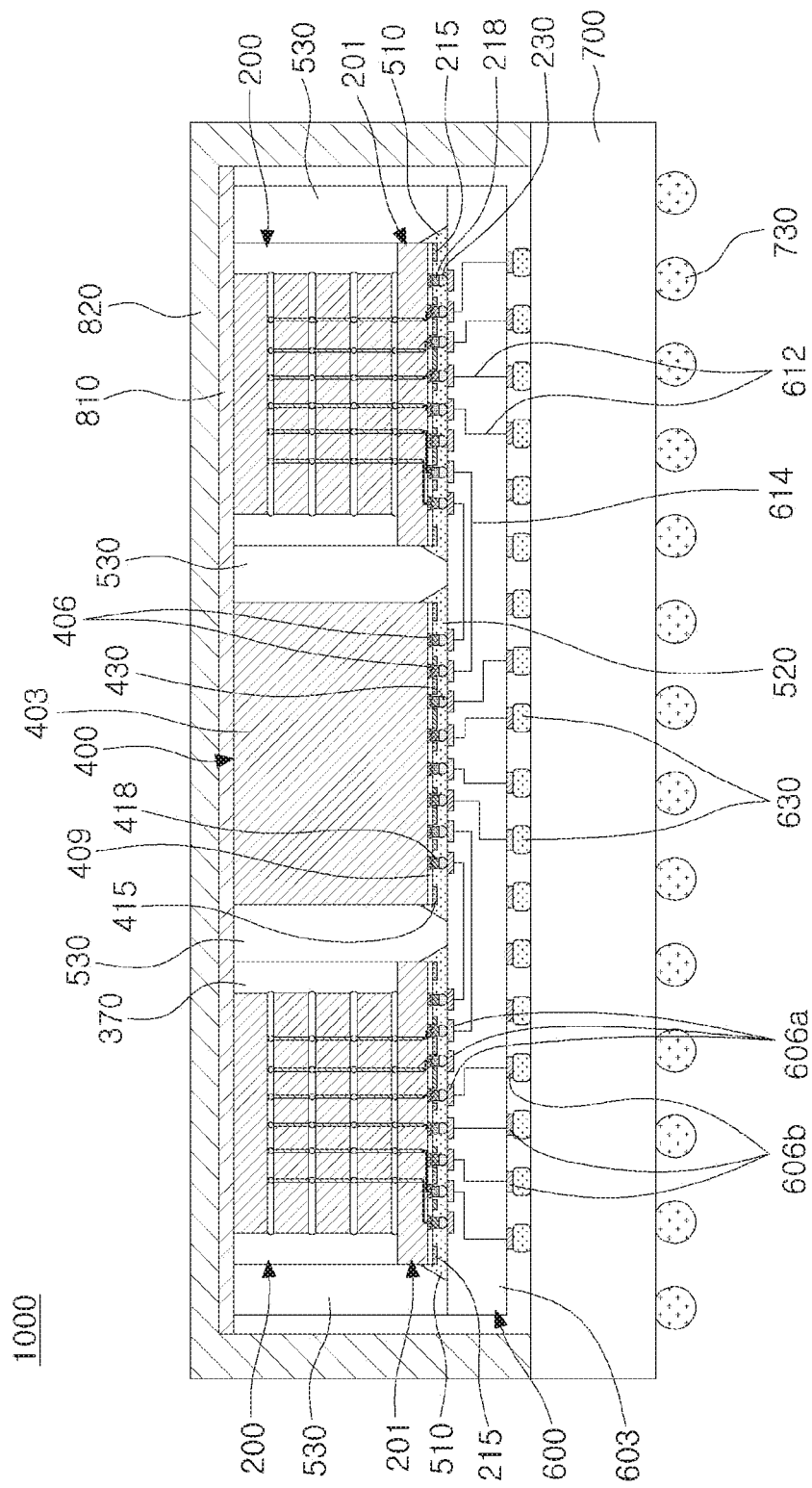
FIG. 7 is a schematic cross-sectional view illustrating an example of a semiconductor package according to some example embodiments.

A semiconductor package according to some example embodiments will be described with reference to FIG. 7. FIG. 7 is a schematic cross-sectional view illustrating a semiconductor package according to some example embodiments.

Referring to FIG. 7, a semiconductor package 1000 in an example embodiment may include a base 600, and the first semiconductor package 200 as described in FIG. 6, which are disposed as one or a plurality of semiconductor packages on the base 600.

The semiconductor package 1000 may further include a third chip 400 disposed on the base 600.

In some example embodiments, the upper surface of the third chip 400 and the upper surface of the first semiconductor package 200 may be positioned on substantially the same height level.

In some example embodiments, the third chip 400 may be a processor unit. For example, the third chip 400 may include a central processing unit (CPU), a graphics processing unit (GPU), and a digital signal processor (DSP). The third chip 400 may include an application processor (AP). The application processor (AP) may be configured as a wireless communication application or an application specific IC (ASIC).

In some example embodiments, and with reference to FIGS. 1 and 2A to 2D, the third chip 400 may include the substrate 3, the capping insulation layer 9, the pad patterns 6, the plurality of pillars 18, the passivation layer 15 having the plurality of openings 15a, 15a' and 15b, and a substrate 403 that may respectively correspond to the connection patterns 30. The third chip 400 may also include a capping insulating layer 409, pad patterns 406, a plurality of pillars 418, a passivation layer 415, and second connection patterns 430.

The first connection patterns 230 of the first semiconductor package 200 and the second connection patterns 430 of the third chip 400 may be connected to upper base pads 606a arranged on an upper surface of the base 600, while being in contact therewith.

The base 600 may be an interposer or a redistribution substrate.

The base 600 may include an upper redistribution layer 614 electrically connecting the first semiconductor package 200 and the third chip 400.

The base 600 may electrically connect the first semiconductor package 200 and lower base pads 606b formed below the base 600, and may further include an internal wiring 612 electrically connecting the third chip 400 and the lower base pads 606b.

The semiconductor package 1000 may further include a first underfill material layer 510 arranged on the base 600 and filling between the first semiconductor package 200 and the base 600, and a second underfill material layer 415 filling between the third chip 400 and the base 600.

The semiconductor package 1000 may further include a mold layer 530 arranged on a side surface of the first semiconductor package 200 and a side surface of the third chip 400, on the base 600.

The semiconductor package 1000 may further include a package substrate 700 below the base 600, third connection patterns 630 connecting the package substrate 700 and the base 600, and fourth connection patterns 730 below the package substrate 700.

Each of the third and fourth connection patterns 630 and 730 may be greater than each of the first and second connection patterns 230 and 430.

The semiconductor package 1000 may further include a heat transfer material layer 810 and a heat dissipation member 820. The heat dissipation member 820 may cover the first semiconductor package 200 and the third chip 400, on the package substrate 700. The heat transfer material layer 810 may be disposed between the heat dissipation member 820 and the first semiconductor package 200 and between the heat dissipation member 820 and the third chip 400.

As set forth above, according to some example embodiments, a semiconductor package may include a passivation layer having a first opening in which a pillar not for a bump shear test (BST) is located and a second opening in which a pillar for BST is located. The second opening may be greater than the first opening. The relatively large second opening may provide a space in which the BST for a pillar may be more precisely and accurately performed, and the pillar that is not subjected to the BST, disposed in the relatively small first opening, may be protected by a passivation layer. Accordingly, a semiconductor package including one or more pillars having increased reliability may be provided.

While some example embodiments have been illustrated and described above, it will be apparent to those skilled in the art that modifications and variations could be made without departing from the scope of the present inventive concepts as defined by the appended claims.

What is claimed is:
1. A semiconductor package comprising:
a base;
a first chip on the base; and
first connection patterns that connect and couple the base and the first chip,
wherein the first chip includes a substrate, pad patterns on the substrate, a passivation layer on the substrate and having openings, and pillars on the substrate,
wherein the pad patterns include a first signal pad and a second signal pad,
wherein the first connection patterns are in contact with the pillars,
wherein the pillars include a first signal pillar in contact with the first signal pad and a second signal pillar in contact with the second signal pad,
wherein the openings in the passivation layer include a first opening having a sidewall facing a side surface of the first signal pillar and surrounding the side surface of the first signal pillar, and a second opening having a sidewall facing a side surface of the second signal pillar and surrounding the side surface of the second signal pillar, and
wherein a maximum width of the second opening is greater than a maximum width of the first opening.

2. The semiconductor package of claim 1, wherein a minimum distance between the sidewall of the second opening and the side surface of the second signal pillar is greater than a maximum distance between the sidewall of the first opening and the side surface of the first signal pillar.

3. The semiconductor package of claim 1, wherein the sidewall of the first opening is spaced apart from the first signal pillar at substantially an equal distance in a first horizontal direction and a second horizontal direction,
wherein the sidewall of the second opening is spaced apart from the second signal pillar in the first horizontal direction and the second horizontal direction by different distances, and
wherein the first horizontal direction and the second horizontal direction are perpendicular to each other.

4. The semiconductor package of claim 1, wherein the pillars further comprise a first dummy pillar and a second dummy pillar,
wherein the first and second dummy pillars are spaced apart from the pad patterns,
wherein the openings further comprise a third opening facing a side surface of the first dummy pillar and surrounding the side surface of the first dummy pillar, and
wherein a portion of the second dummy pillar is located in the second opening.

5. The semiconductor package of claim 4, wherein the passivation layer comprises a first portion having a linear-shaped side surface extending in a first horizontal direction and at least one second portion extending from a side surface of the first portion into the second opening in a second horizontal direction perpendicular to the first horizontal direction,
wherein the first portion of the passivation layer faces the first signal pillar, and
wherein the second portion of the passivation layer faces the second dummy pillar.

6. The semiconductor package of claim 1, wherein a portion of the passivation layer overlaps a portion of the first signal pad in a vertical direction, and wherein the second signal pad does not overlap the passivation layer in the vertical direction.

7. The semiconductor package of claim 1, wherein the passivation layer has a thickness of about 4 μm to about 7 μm, and wherein each of the pillars has a thickness of about 17 μm to about 23 μm.

8. The semiconductor package of claim 1, wherein each of the pillars comprises a lower layer, a first metal layer on the lower layer, a second metal layer on the first metal layer, and a third metal layer on the second metal layer,
wherein the first metal layer has a thickness greater than a thickness of the second metal layer,
wherein the second metal layer has a thickness greater than a thickness of the third metal layer, and
wherein the third metal layer has a thickness greater than a thickness of the lower layer.

9. The semiconductor package of claim 8, wherein the thickness of the first metal layer is greater than a thickness of the passivation layer, and
wherein the passivation layer has a thickness greater than the thickness of the second metal layer.

10. The semiconductor package of claim 1, wherein the pad patterns further comprise a first adjacent pattern adjacent to the first signal pad and a second adjacent pattern adjacent to the second signal pad,
wherein the passivation layer overlaps the first adjacent pattern in a vertical direction, and
wherein the passivation layer does not overlap with at least a portion of the second adjacent pattern in the vertical direction.

11. The semiconductor package of claim 1, further comprising an underfill material layer filling between the base and the first chip while filling the openings in the passivation layer.

12. The semiconductor package of claim 11, further comprising a mold layer covering the first chip, on the base,
wherein the underfill material layer extends to cover a portion of a side surface of the first chip while filling between the base and the first chip, and
wherein the first chip is a dynamic random access memory (DRAM) chip.

13. The semiconductor package of claim 1, wherein the first chip further comprises a capping insulating layer on the substrate,
wherein the capping insulating layer includes a first capping insulating layer and a second capping insulating layer sequentially stacked,
wherein the first capping insulating layer and the second capping insulating layer include different materials,
wherein the capping insulating layer includes a first capping opening that covers the pad patterns and that exposes a portion of the first signal pad, and a second capping opening that exposes a portion of the second signal pad,
wherein each of the first and second signal pillars includes a lower portion and an upper portion having a greater width than the lower portion,
wherein the lower portion of the first signal pillar contacts the first signal pad and is within the first capping opening,
wherein the lower portion of the second signal pillar contacts the second signal pad and is within the second capping opening, and
wherein the passivation layer is on the capping insulating layer.

14. The semiconductor package of claim 13, further comprising:
second chips sequentially stacked on the first chip; and
intermediate connection bumps that couple second chips adjacent to each other among the second chips, and lower connection bumps that couple a lowest of the second chips with the first chip,
wherein a width of each of the intermediate connection bumps and the lower connection bumps is less than a width of each of the first connection patterns.

15. The semiconductor package of claim 14, further comprising:
a third chip on the base;
second connection patterns connecting the third chip and the base;
a package substrate below the base; and
third connection patterns connecting the base and the package substrate,
wherein a thickness of the third chip is greater than a thickness of the first chip,
wherein the base includes a first internal wiring electrically connecting the first chip and the third chip, a second internal wiring electrically connecting portions of the third connection patterns and the first chip, and a third internal wiring electrically connecting portions of the third connection patterns and the third chip, and
wherein a width of each of the second connection patterns is greater than a width of each of the first connection patterns.

16. The semiconductor package of claim 1, wherein the first chip further comprises a capping insulating layer on the substrate,
wherein the capping insulating layer surrounds side surfaces of the pad patterns and exposes upper surfaces of the pad patterns, and
wherein the passivation layer is on the capping insulating layer.

17. A semiconductor package comprising:
a substrate;
pad patterns on the substrate;
a passivation layer on the substrate and having openings;
pillars on the substrate; and
connection patterns on the pillars,
wherein the pad patterns include a first signal pad and a second signal pad,
wherein the pillars include a first signal pillar in contact with the first signal pad, and a second signal pillar in contact with the second signal pad,
wherein a center between upper and lower surfaces of each of the pillars is positioned on a level higher than a level of an upper surface of the passivation layer, when viewed from the substrate,
wherein the openings in the passivation layer include a first opening and a second opening having different sizes or widths,
wherein the first signal pillar passes through the first opening, and
wherein the second signal pillar passes through the second opening.

18. The semiconductor package of claim 17, wherein the pillars further comprise a dummy pillar passing through the second opening,
wherein the first opening is one of a plurality of first openings,
wherein the first signal pillar is one of a plurality of first signal pillars, each first signal pillar passing through a respective one of the plurality of first opening, and
wherein the second signal pillar is one of a plurality of second signal pillars passing through the second opening.

19. A semiconductor package comprising:
a substrate;
a plurality of pad patterns on the substrate;
a passivation layer on the substrate and having a plurality of openings;
a plurality of pillars on the substrate; and
connecting layers on the plurality of pillars,
wherein the plurality of pad patterns include a plurality of signal pads,
wherein the plurality of pillars include a plurality of signal pillars contacting the plurality of signal pads and a plurality of dummy pillars spaced apart from the plurality of pad patterns,
wherein the openings in the passivation layer include a first opening and a second opening,
wherein the plurality of signal pads include a first signal pad and a second signal pad,
wherein the plurality of pillars include a first signal pillar in the first opening and a second signal pillar in the second opening, wherein a maximum distance between the first signal pillar and the first opening is less than ½ of a width of the first signal pillar, and wherein a maximum distance between the second signal pillar and the second opening is greater than the width of the first signal pillar.

20. The semiconductor package of claim 19, wherein a minimum distance between the second signal pillar and a sidewall of the second opening is about 30 μm in at least one of a first horizontal direction and a second horizontal direction, wherein the first horizontal direction and the second horizontal direction are perpendicular to each other.

* * * * *